（12）United States Patent
Wu et al.

(10) Patent No.: US 6,979,613 B1
(45) Date of Patent: Dec. 27, 2005

(54) METHOD FOR FABRICATING A TRENCH CAPACITOR OF DRAM

(75) Inventors: Kuo-Chien Wu, Miao-Li (TW); Ping Hsu, Chung-Ho (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 249 days.

(21) Appl. No.: 10/707,027

(22) Filed: Nov. 16, 2003

(51) Int. Cl.$^7$ .......................................... H01L 21/8242
(52) U.S. Cl. ...................... 438/243; 438/246; 438/248; 438/386; 438/389; 438/391
(58) Field of Search ................................ 438/243, 246, 438/248, 249, 386, 389, 391, 392

(56) References Cited

U.S. PATENT DOCUMENTS 5,360,758 A * 11/1994 Bronner et al. ............. 438/243
5,614,431 A *  3/1997 DeBrosse .................... 438/243
6,916,721 B2 *  7/2005 Heineck et al. ............. 438/389
6,930,004 B2 *  8/2005 Wang et al. ................. 438/268
2005/0106831 A1 *  5/2005 Hsu et al. .................... 438/386

* cited by examiner

Primary Examiner—Amir Zarabian
Assistant Examiner—Toniae M. Thomas
(74) Attorney, Agent, or Firm—Winston Hsu (57) ABSTRACT

A method for fabricating a deep trench capacitor. A substrate is provided having a pad oxide layer and a pad nitride layer stacked on a main surface thereof. A deep trench is etched into the substrate through the pad oxide layer and the pad nitride layer. A node dielectric is coated on the interior surface of the deep trench. A silicon spacer layer is formed on the sidewall of the deep trench over the node dielectric. An upper portion of the silicon spacer layer is doped with dopants such as $BF_2$. The undoped portion of the silicon spacer layer is selectively removed to expose a portion of the node dielectric. The exposed node dielectric is stripped off to expose the substrate. The remaining node dielectric covered by the doped silicon spacer layer forms a protection spacer for protecting the pad oxide layer from corrosion during the subsequent etching processes.

10 Claims, 11 Drawing Sheets

METHOD FOR FABRICATING A TRENCH CAPACITOR OF DRAM

BACKGROUND OF INVENTION

1. Field of the Invention

The present invention relates to a semiconductor process, and more particularly, to a process of manufacturing a deep trench capacitor of a DRAM device.

2. Description of the Prior Art

Trench-capacitor DRAM devices are known in the art. A trench-storage capacitor typically consists of a very-high-aspect-ratio contact-style hole pattern etched into the substrate, a thin storage-node dielectric insulator, a doped low-pressure chemical vapor deposition (LPCVD) polysilicon fill, and buried-plate diffusion in the substrate. The doped LPCVD silicon fill and the buried plate serve as the electrodes of the capacitor. A dielectric isolation collar in the upper region of the trench prevents leakage of the signal charge from the storage-node diffusion to the buried-plate diffusion of the capacitor.

In general, the prior art method for fabricating a trench capacitor of a DRAM device may include several major manufacture phases as follows:

Phase 1: deep trench etching.

Phase 2: buried plate and capacitor dielectric (or node dielectric) forming.

Phase 3: first polysilicon deep trench fill and first recess etching.

Phase 4: collar oxide forming.

Phase 5: second polysilicon deposition and second recess etching.

Phase 6: collar oxide wet etching (including an extra over-etching stage).

Phase 7: third polysilicon deposition and third recess etching.

Phase 8: shallow trench isolation (hereinafter referred to as "STI") forming.

Figure 1:
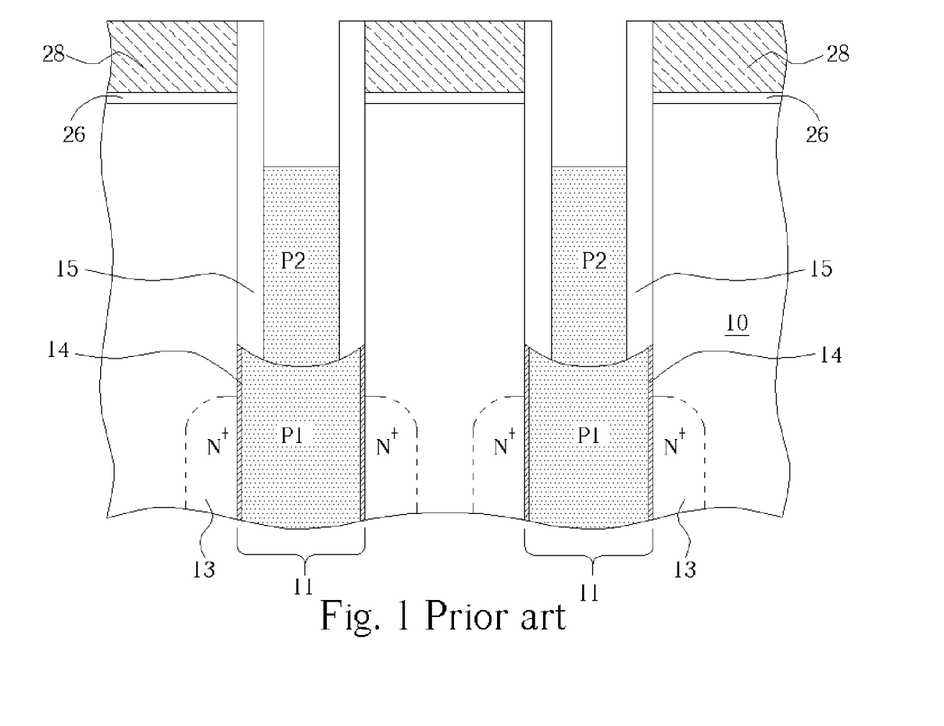
FIG. 1 and FIG. 2 are schematic cross-sectional diagrams showing several intermediate steps of forming a prior art deep trench capacitor (before STI process), which are relative to the present invention.
Figure 2:
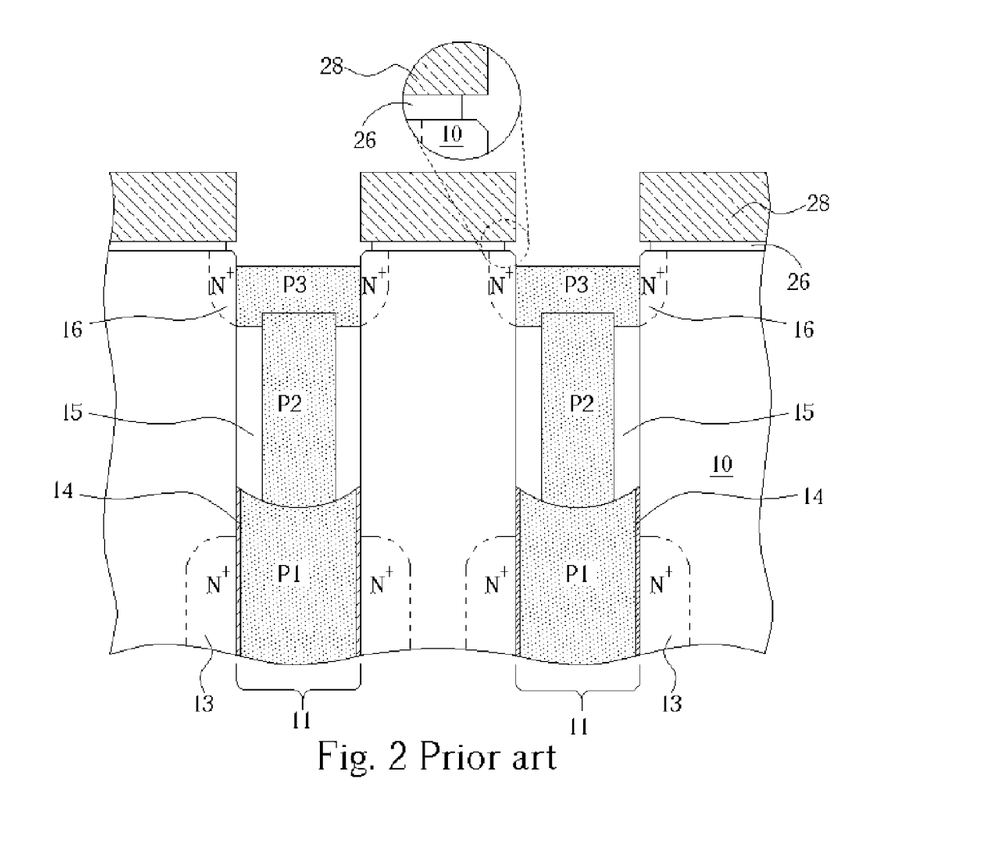

Please refer to FIG. 1 and FIG. 2. FIG. 1 and FIG. 2 are schematic cross-sectional diagrams showing several intermediate steps of forming a prior art deep trench capacitor (before STI process), which are relative to the present invention. As shown in FIG. 1, a substrate 10 having a pad oxide layer 26 and a pad nitride layer 28 thereon is provided. After deep trench etching, an N+ buried plate 13 and a node dielectric layer 14 are sequentially formed in the deep trench. A first polysilicon deposition and recess process is then carried out to form a first poly layer (Poly1) at the bottom of the deep trench. A collar oxide layer 15 is formed on sidewall of the deep trench above Poly1. A second polysilicon deposition and recess process is then carried out to form a second poly layer (Poly2) atopPoly1. The collar oxide layer 15 that is not covered by Poly 2 is stripped off to expose the sidewall of the deep trench. Subsequently, as shown in FIG. 2, a third polysilicon deposition and recess process is carried out to form a third poly layer (Poly3) atopPoly2 and collar oxide layer 15. Dopants of the heavily doped Poly2 diffuse out through Poly3 to the surrounding substrate 10 to form an annular shaped buried strap out diffusion regions 16 in the following thermal process.

The above-mentioned prior art method has one drawback in that when wet etching the exposed collar oxide 15 that is not covered by the second polysilicon layer (P2), a portion of the pad oxide layer 26 is eroded due to over-etching of the collar oxide 15. As specifically indicated in the dash line circle region, the pad oxide layer 26 is slightly "pulled back" around the top of the deep trench. This causes undesired silicon corner rounding effect on the exposed silicon substrate surface around the top of the deep trench. The corner-rounding phenomenon becomes worse after going through following cleaning and oxidation processes, and may adversely affect bit line contact (CB) formation. The device performance might be degraded because the contact surface area is shrunk.

SUMMARY OF INVENTION

Accordingly, the primary object of the present invention is to provide a method for fabricating a deep trench capacitor and trench capacitor memory devices, which is capable of avoiding the above-mentioned problems.

According to the claimed invention, a method for fabricating a trench capacitor is disclosed. A semiconductor substrate having a pad oxide layer and a pad nitride layer formed thereon is provided. A deep trench is etched into the pad nitride layer, the pad oxide layer and the semiconductor substrate. The deep trench is doped to form a buried doped plate in the semiconductor substrate adjacent to a lower portion of the deep trench. The buried doped plate serves as a first electrode of the trench capacitor. A node dielectric layer is formed on interior surface of the deep trench. A first conductive layer is deposited on the node dielectric layer inside the deep trench. The first conductive layer is recessed to a first depth in the deep trench. The first conductive layer serves as a second electrode of the trench capacitor. A spacer silicon layer is deposited on the node dielectric layer on sidewall of the deep trench. An upper portion of the spacer silicon layer is locally ion doped. The non-doped spacer silicon layer is selectively removed to expose the node dielectric layer. The exposed node dielectric layer is removed to expose a silicon surface inside the deep trench, and simultaneously forming a dielectric spacer protecting the pad oxide layer. The exposed silicon surface inside the deep trench and the doped spacer silicon layer are simultaneously oxidized, thereby forming a thermal silicon oxide layer and an oxide spacer, respectively.

It is to be understood that both the foregoing general description and the following detailed description are exemplary, but are not restrictive, of the invention. Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 3:
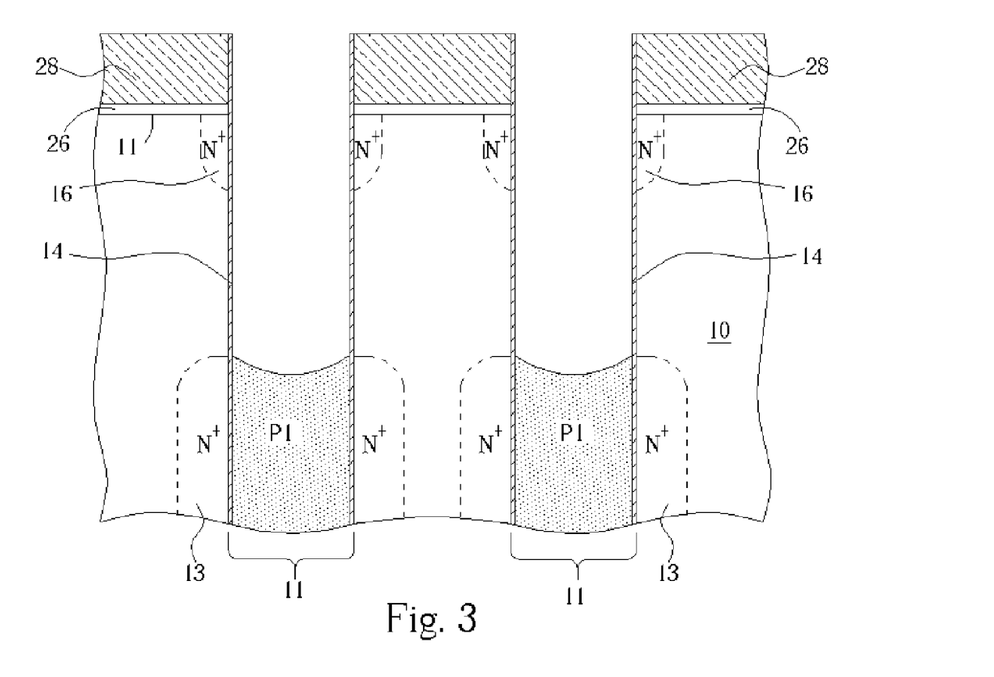
FIG. 3 to FIG. 11 are schematic cross-sectional diagrams illustrating the method for fabricating deep trench capacitor according to the preferred embodiment of the present invention.

Please refer to FIG. 3 to FIG. 11. FIG. 3 to FIG. 11 are schematic cross-sectional diagrams illustrating the method for fabricating deep trench capacitor according to the preferred embodiment of the present invention. As shown in FIG. 3, a semiconductor substrate 10 such as a silicon substrate is provided. The semiconductor substrate 10 has a main surface 11, on which a variety of semiconductor devices such as metal-oxide-semiconductor (MOS) transistors are fabricated. A pad oxide layer 26 and a pad nitride layer 28 are sequentially formed on the main surface 11 of the semiconductor substrate 10. The pad oxide layer 26 may be grown to a thickness of about 50 angstroms or below by any suitable method known in the art, for example, thermal oxidation. The pad nitride layer may be formed by conventional chemical vapor deposition (CVD) methods.

A photoresist layer is then patterned on the pad nitride layer 28. The photoresist layer contains an opening exposing the deep trench capacitor region to be defined in the substrate. Uisng the photoresist layer as an etching mask, a deep trench dry etching is then carried out to form a deep trench 11 in the substrate 10, which has a depth of about 7 micrometers or deeper. The formation of a deep trench in a silicon substrate is known in the art. Dry etching such as RIE is typically used to form a deep trench in the semiconductor substrate 10. After removing the remaining photoresist, a buried plate 13 that is adjacent to a lower portion of the deep trench 11, and a node dielectric layer 14 are sequentially formed. The buried plate 13 serves as one electrode plate of the deep trench capacitor. A first polysilicon deposition and recess process is carried out to form a first polysilicon layer (P1) inside the deep trench 11. The method of forming the buried plate 13 comprises the steps of depositing a thin layer of arsenic silicate glass (ASG) at a lower portion of the deep trench, followed by thermal drive in. It is understood that other doping methods such as gas phase doping (GPD) or the like may be employed. The node dielectric layer 14 may be oxide-nitride (ON) or oxide-nitride-oxide (ONO), but not limited thereto.

Figure 4:
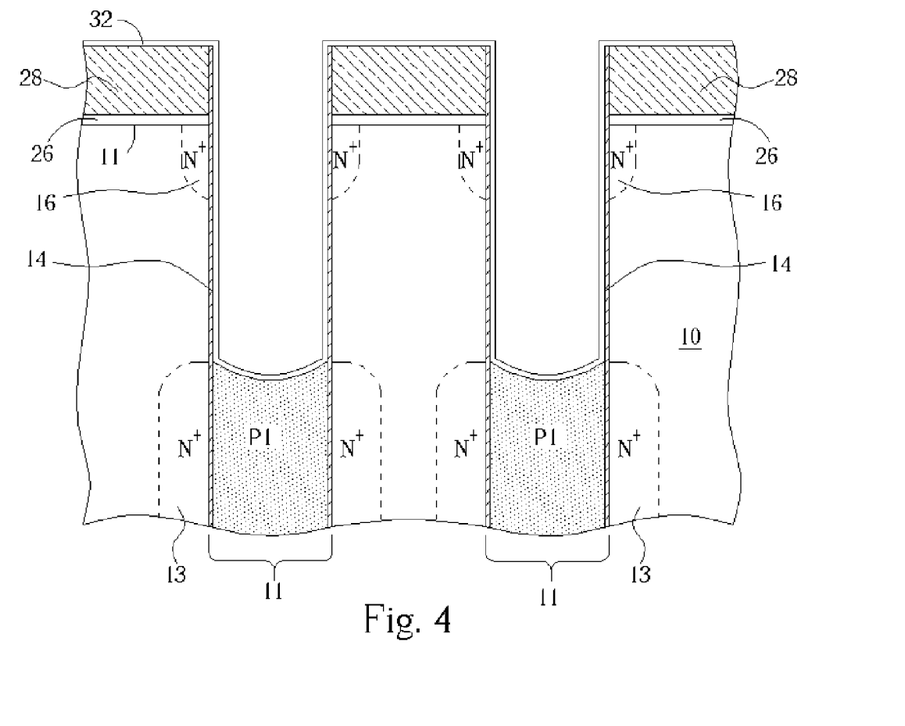

As shown in FIG. 4, a CVD process such as low-pressure chemical vapor deposition (LPCVD) is carried out to deposit an amorphous silicon film 32 with a thickness of about 100~150 angstroms on the pad nitride layer 28, the node dielectric layer 14, and on the top surface of the first polysilicon layer (P1).

Figure 5:
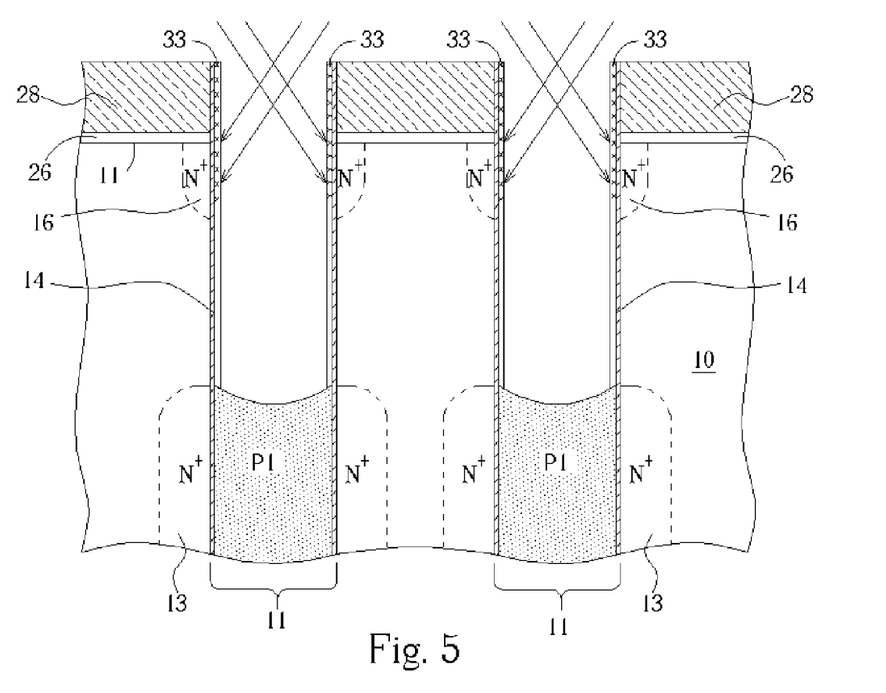

As shown in FIG. 5, an anisotropc etching is performed to etch the amorphous silicon film 32. The etching stops when the top surface of the first polysilicon layer (P1) is exposed. At this time, an amorphous silicon spacer 33 is formed on the sidewall of the deep trench 11 above the first polysilicon layer (P1). The amorphous silicon spacer 33 is used to mask the node dielectric layer 14 on the sidewall of the deep trench 11 above the first polysilicon layer (P1). A tilt angle ion implantation process is carried out to dope dopants such as $BF_2$ ions into the upper portion of the amorphous silicon spacer 33.

Figure 6:
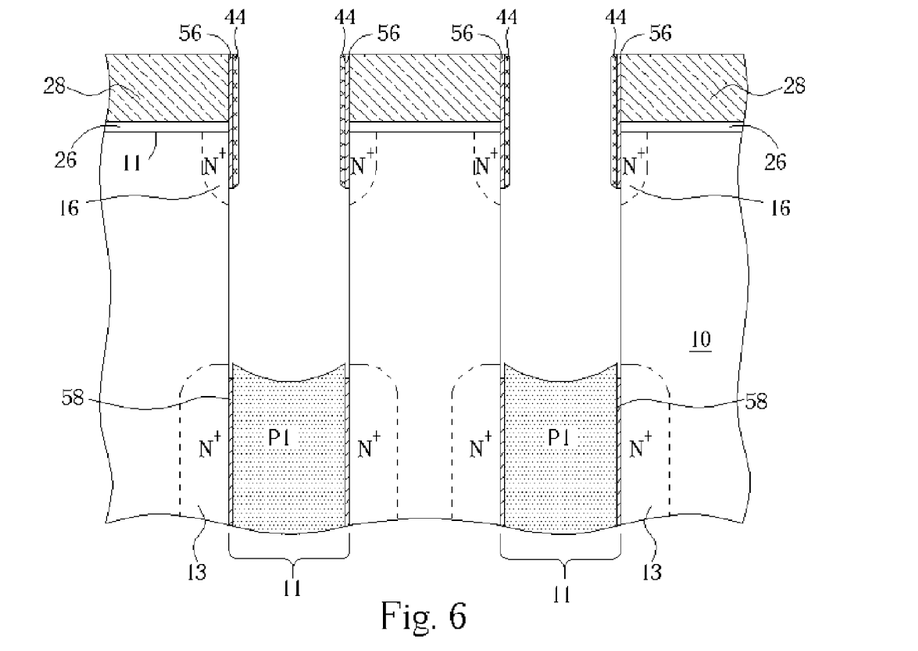

As shown in FIG. 6, the non-doped lower portion of the amorphous silicon spacer 33 is then selectively removed by using wet chemistry such as diluted ammonia solution, thereby exposing a portion of the node dielectric layer 14 above the first polysilicon layer (P1). The doped amorphous silicon spacer 33 that is not removed by diluted ammonia solution is now designated as spacer 44. Next, a wet etching is performed to etch away the exposed node dielectric layer 14 above the first polysilicon layer (P1). A silicon surface inside the deep trench 11 approximately between the spacer 44 and the first polysilicon layer (P1) is exposed. The node dielectric layer 14 is now divided into an upper and lower sections, wherein the upper section of the node dielectric layer 14 is denoted as 56, which is masked by the spacer 44, while the lower section of the node dielectric layer 14 is denoted as 58, which serves as capacitor dielectric and isolates the first polysilicon layer (P1) from the buried plate 13. The spacer 44 and the upper section node dielectric 56 constitute an annular protection structure that protects the pad oxide layer 26 around the top of the deep trench 11 from corrosion.

Figure 7:
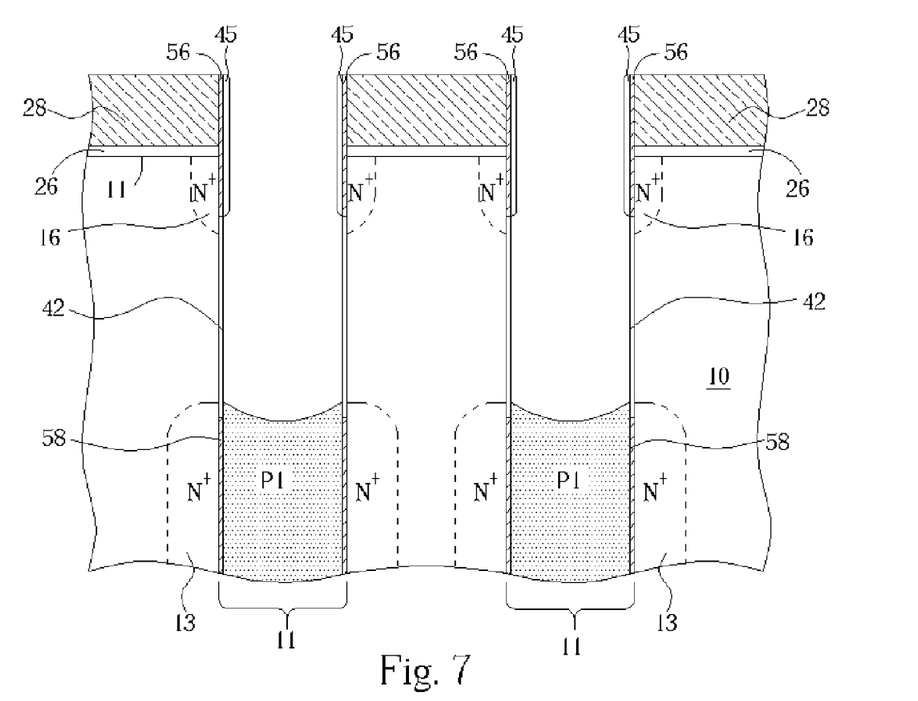

As shown in FIG. 7, an oxidation process is carried out to grow a thermal silicon oxide layer 42 on the exposed silicon surface inside the deep trench 11, and simultaneously oxidize the amorphous spacer 44. The oxidized amorphous spacer 44 is now denoted as 45. Subsequently, in accordance with another preferred embodiment of this invention, a wet etching process such as diluted HF dipping may be optionally performed to completely remove the oxidized amorphous spacer 45 or remove a thickness of the oxidized amorphous spacer 45.

Figure 8:
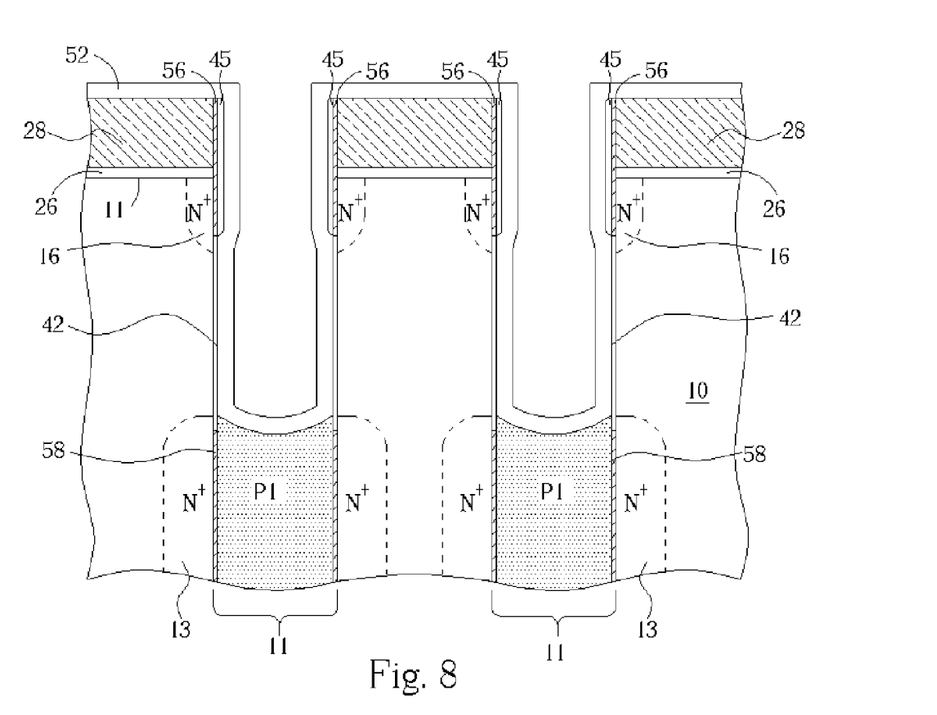
Figure 9:
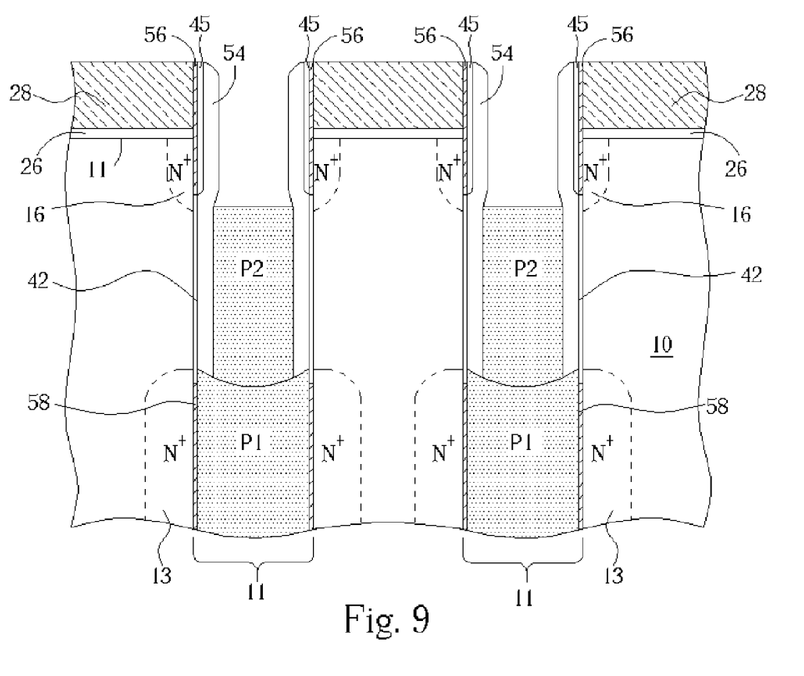

As shown in FIG. 8, a CVD process is carried out to deposit a conformal silicon oxide layer 52 on the pad nitride layer 28, on the surface of the spacer 45, the thermal silicon oxide layer 42, and on the top surface of the first polysilicon layer (P1). As shown in FIG. 9, an anisotropic dry etching is carried out to etch the silicon oxide layer 52, thereby exposing the top surface of the first polysilicon layer (P1). The remaining silicon oxide layer 52 becomes a collar oxide layer 54 located on sidewall of the deep trench 11 above the first polysilicon layer (P1). Subsequently, a second polysilicon deposition and recess process is carried out to form a second polysilicon layer (P2) atop the first polysilicon layer (P1)inside the deep trench 11. The second polysilicon deposition and recess process includes the steps of filling the deep trench with a layer of doped polysilicon, followed by etching back the doped polysilicon to a depth of about 1200~2000 angstroms below the main surface 11 of the substrate 10.

Figure 10:
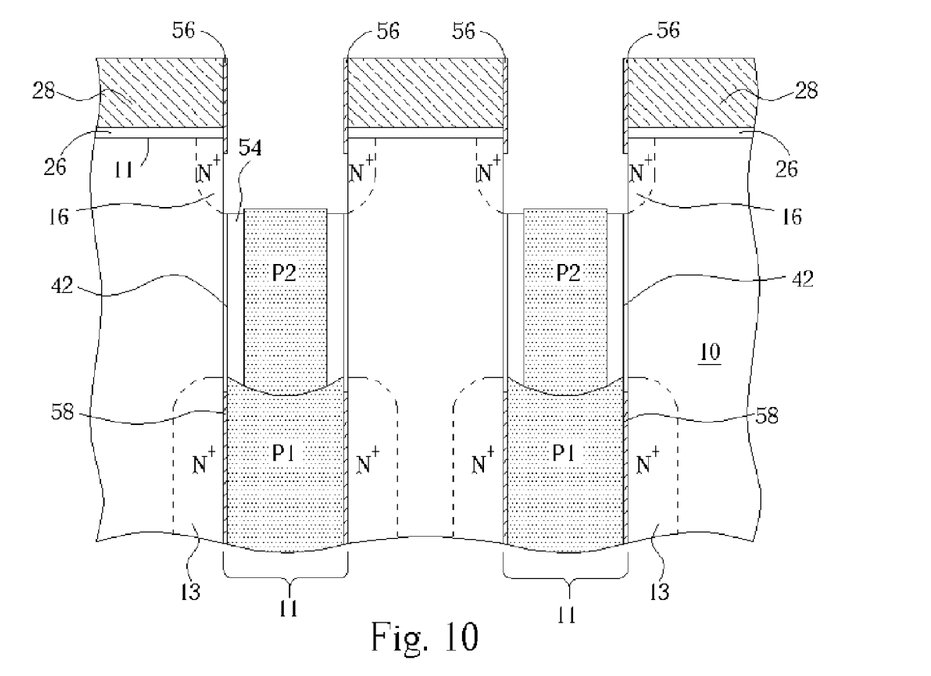

As shown in FIG. 10, a wet etching such as diluted HF is used to remove the collar oxide layer 54 inside the deep trench 11, which is not covered by the second polysilicon layer (P2). The spacer 45 is also removed. It is one of the main features of the present invention that when wet etching the collar oxide layer 54, the pad oxide layer 26 around the top of the deep trench is protected by the upper section node dielectric 56. As a result, the pad oxide pull back phenomenon is eliminated.

Figure 11:
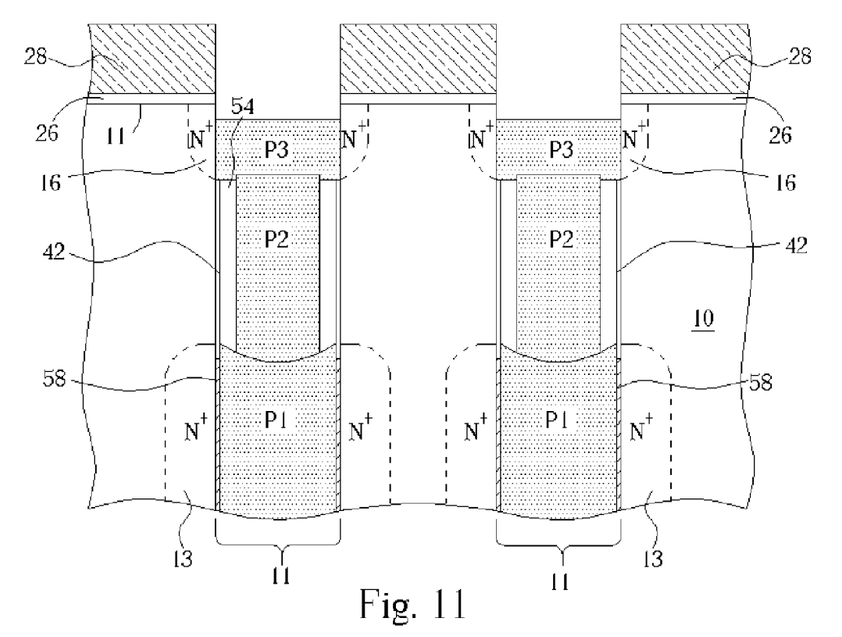

Finally, as shown in FIG. 11, the upper section node dielectric 56 is stripped off by wet chemistry such as phosphoric acid. A third polysilicon deposition and recess process is then carried out to form a third polysilicon layer (P3) atop the second polysilicon layer (P3)inside the deep trench 11. The third polysilicon layer (P3) is also referred to as a buried strap layer. The third polysilicon deposition and recess process includes the steps of filling the deep trench with a layer of non-doped polysilicon, followed by etching back the non-doped polysilicon to a depth of about 100~500 angstroms below the main surface 11 of the substrate 10. In the subsequent thermal process, dopants such as arsenic ions diffuse from the second polysilicon layer (P2) through the third polysilicon layer (P3) to the adjacent silicon substrate, thereby forming buried strap out diffusion regions 16.

Those skilled in the art will readily observe that numerous modifications and alterations of the present invention may be made while retaining the teachings of the invention.

Accordingly, the above disclosure should be construed as limited only by the metes and bounds of the appended claims.

What is claimed is:

1. A method for fabricating a trench capacitor of DRAM devices, comprising:
   providing a semiconductor substrate having a pad oxide layer and a pad nitride layer formed thereon;
   etching a deep trench into the pad nitride layer, the pad oxide layer and the semiconductor substrate;
   doping the deep trench to form a buried doped plate in the semiconductor substrate adjacent to a lower portion of the deep trench, the buried doped plate serving as a first electrode of the trench capacitor;
   forming a node dielectric layer on interior surface of the deep trench;
   depositing a first conductive layer on the node dielectric layer inside the deep trench;
   recessing the first conductive layer to a first depth in the deep trench, the first conductive layer serving as a second electrode of the trench capacitor;
   depositing a spacer silicon layer on the node dielectric layer on sidewall of the deep trench;
   locally ion doping an upper portion of the spacer silicon layer;
   selectively removing the non-doped spacer silicon layer to expose the node dielectric layer;
   removing the exposed node dielectric layer to expose a silicon surface inside the deep trench, and simultaneously forming a dielectric spacer protecting the pad oxide layer; and
   simultaneously oxidizing the exposed silicon surface inside the deep trench and the doped spacer silicon layer, thereby forming a thermal silicon oxide layer and an oxide spacer, respectively.

2. The method of claim 1 wherein after oxidizing the exposed silicon surface inside the deep trench and the doped spacer silicon layer, the method further comprises:
   forming a collar oxide layer on sidewall of the deep trench;
   forming a second polysilicon layer atop the first polysilicon layer inside the deep trench;
   recessing the second polysilicon layer to a second depth inside the deep trench;
   wet etching the collar oxide layer that is not covered by the recessed second polysilicon layer;
   removing the oxide spacer; and
   removing the dielectric spacer.

3. The method of claim 1 wherein the spacer silicon layer is made of amorphous silicon.

4. The method of claim 1 wherein the spacer silicon layer has a thickness of about 100~150 angstsoms.

5. The method of claim 1 wherein the method of locally ion doping an upper portion of the spacer silicon layer includes tilt angle ion implantation.

6. The method of claim 1 wherein the method of locally ion doping an upper portion of the spacer silicon layer includes doping $BF_2$ ions.

7. The method of claim 1 wherein the node dielectric layer is oxide-nitride-oxide (ONO) dielectric.

8. The method of claim 1 wherein the node dielectric layer is oxide-nitride (ON) dielectric.

9. The method of claim 1 wherein the node dielectric layer comprises silicon nitride.

10. The method of claim 1 wherein the step of selectively removing the non-doped spacer silicon layer to expose the node dielectric layer involves the use of diluted ammonia solution.

* * * * *